(12) United States Patent
Kim et al.

(10) Patent No.: US 7,256,134 B2
(45) Date of Patent: Aug. 14, 2007

(54) SELECTIVE ETCHING OF CARBON-DOPED LOW-K DIELECTRICS

(75) Inventors: Yunsang Kim, San Jose, CA (US); Neungho Shin, San Jose, CA (US); Heeyeop Chae, San Jose, CA (US); Joey Chiu, Chung-Li (TW); Yan Ye, Saratoga, CA (US); Fang Tian, Fremont, CA (US); Xiaoye Zhao, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 295 days.

(21) Appl. No.: 10/632,873

(22) Filed: Aug. 1, 2003

(65) Prior Publication Data

US 2005/0026430 A1     Feb. 3, 2005

(51) Int. Cl.
*H01L 21/302*     (2006.01)

(52) U.S. Cl. ............ 438/723; 156/345.34; 156/345.38; 156/345.44; 156/345.45; 204/298.34; 216/41; 216/67; 216/70; 216/72; 219/121.4; 315/111.21; 438/695; 438/710; 438/712; 438/714; 438/718; 438/719; 438/724; 438/740; 438/743; 438/744; 438/963

(58) Field of Classification Search ................ 438/723, 438/721, 702, 700
See application file for complete search history.

(56) References Cited

U.S. PATENT DOCUMENTS

| | | | |
|---|---|---|---|
| 5,707,486 A | | 1/1998 | Collins |
| 5,888,414 A | * | 3/1999 | Collins et al. ................ 216/68 |
| 6,014,943 A | * | 1/2000 | Arami et al. ............ 118/723 E |
| 6,090,403 A | * | 7/2000 | Block et al. ................ 424/447 |
| 6,168,726 B1 | | 1/2001 | Li et al. |
| 6,194,128 B1 | | 2/2001 | Tao et al. |
| 6,281,135 B1 | * | 8/2001 | Han et al. ................... 438/725 |

(Continued)

FOREIGN PATENT DOCUMENTS

| | | |
|---|---|---|
| EP | 1059664 | 12/2000 |
| EP | 1308994 | 5/2003 |
| JP | 2001127040 | 11/2001 |
| WO | WO02/19408 | 3/2002 |
| WO | WO03/081645 | 10/2003 |

OTHER PUBLICATIONS

Peter Singer, Editor-in-Chief, Aug. 1, 1999,"Dual-Damascene Challenges Dielectric Etch", http://www.e-insite.net/semiconductor/index.asp?layout=articlePrint&articleID=CA165320, last visited May 29, 2003.

(Continued)

*Primary Examiner*—Nadine G. Norton
*Assistant Examiner*—Patricia A George
(74) *Attorney, Agent, or Firm*—Moser IP Law Group

(57) ABSTRACT

The present invention includes a process for selectively etching a low-k dielectric material formed on a substrate using a plasma of a gas mixture in a plasma etch chamber. The gas mixture comprises a fluorine-rich fluorocarbon or hydrofluorocarbon gas, a nitrogen-containing gas, and one or more additive gases, such as a hydrogen-rich hydrofluorocarbon gas, an inert gas and/or a carbon-oxygen gas. The process provides a low-k dielectric to a photoresist mask etching selectivity ratio greater than about 5:1, a low-k dielectric to a barrier/liner layer etching selectivity ratio greater about 10:1, and a low-k dielectric etch rate higher than about 4000 Å/min.

18 Claims, 8 Drawing Sheets

U.S. PATENT DOCUMENTS

| | | |
|---|---|---|
| 6,284,149 B1 | 9/2001 | Li et al. |
| 6,287,978 B1* | 9/2001 | Becker et al. ............... 438/723 |
| 6,291,357 B1* | 9/2001 | Zhang et al. ................ 438/714 |
| 6,346,482 B2 | 2/2002 | Matsumoto et al. |
| 6,362,109 B1* | 3/2002 | Kim et al. .................. 438/706 |
| 6,410,437 B1 | 6/2002 | Flanner et al. |
| 6,410,451 B2* | 6/2002 | Nguyen et al. .............. 438/713 |
| 6,426,477 B1* | 7/2002 | Koshimizu et al. .... 219/121.41 |
| 6,451,703 B1* | 9/2002 | Liu et al. .................... 438/710 |
| 6,569,777 B1 | 5/2003 | Hsu et al. |
| 6,828,251 B2* | 12/2004 | Su et al. ..................... 438/724 |
| 6,869,542 B2* | 3/2005 | Desphande et al. ............ 216/51 |
| 6,894,245 B2* | 5/2005 | Hoffman et al. ........ 219/121.43 |
| 6,897,154 B2* | 5/2005 | Leung et al. ................. 438/706 |
| 2002/0061654 A1 | 5/2002 | Kanegae et al. |
| 2002/0111036 A1* | 8/2002 | Zhu et al. ................... 438/754 |
| 2003/0024902 A1 | 2/2003 | Li et al. |
| 2003/0109143 A1 | 6/2003 | Hsieh et al. |
| 2003/0211750 A1 | 11/2003 | Kim et al. |
| 2003/0235993 A1 | 12/2003 | Leung et al. |
| 2004/0180556 A1 | 9/2004 | Chiang et al. |

OTHER PUBLICATIONS

"Copper, with and without Damascene", http://www.semiconductor.net/technical/damascene_copper.htm, last visited Jul. 24, 2002.

"Etching of Silicon Nitride", Application of Silicon Nitride, http://courses.nus.edu.sg/course/phyweets/Projects98/etch/si3n4.htm, last visited Jul. 23, 2002.

European Search Report for Application 04018095.2-1235, Mar. 23, 2005.

Morikawa Y, et al: "Control of Surface Reaction on Highly Accurate Low-K Methylsilsesquioxane Etching Process" Japanese Journal of Applied Physics. Tokyo, JP, vol. 42, No. 12A, Part 2, Dec. 1, 2001, pp. L1406-L1408, XP001164580 ISSN: 00221-4922, p. L1407.

* cited by examiner

SELECTIVE ETCHING OF CARBON-DOPED LOW-K DIELECTRICS

The present application relates to semiconductor processing technologies, and particularly to etching patterns in a layer of dielectric material having low dielectric constant.

BACKGROUND

The maximum operating speed of current semiconductor devices is limited by the time delay factor T=RC of metal lines, where R is the resistance of the metal lines and C is the capacitance of the dielectric insulating material surrounding the metal lines. As the minimum feature size of integrated circuits continues to shrink, the metal lines become thinner and more densely packed, resulting in greater resistance in the metal lines and larger inter-metal capacitance, and therefore a longer time delay. By changing to different materials, i.e., higher conductivity material for the metal lines and lower permittivity (low-k) dielectric for the insulating material, device geometry can continue to shrink without adversely impacting the maximum operating speed. This has prompted the switch from aluminum and silicon dioxide to copper and low-k dielectrics such as organosilicate glass in the backend process flow for manufacturing many current and future semiconductor devices.

The switch from aluminum/oxide to copper/low-k involves a variety of fundamental changes in the backend manufacturing process flow. Since it is difficult to etch copper, new approaches such as "damascene" or "dual damascene" processing are required. Copper damascene/dual-damascene is a process where vias and trenches are etched into the insulating material. Copper is then filled into the vias and trenches and sanded back so the conducting materials are only left in the vias and trenches. Among the many challenges presented by this process, etching trenches or vias in low-k dielectrics can be tricky due to the more complicated chemical composition of the dielectric material and the many different kinds of low-k dielectric materials available. The etch chemistry for etching a low-k dielectric material may have to be tailored to match up with the amount of carbon, hydrogen, silicon, fluorine and oxygen in the material.

The ratio of the rate of etching a low-k dielectric layer to the rate of etching one of the adjacent layers of other materials is called etching selectivity. A photoresist layer is typically used to mask the low-k dielectric layer during the etching process. As the feature sizes continue to shrink, the photoresist mask becomes thinner in order to meet lithography-related challenges posed by smaller feature sizes. The thinner resist requires tighter control on the dielectric etch selectivity. However, like photoresist, many low-k dielectric materials also contain some carbon and hydrogen, making it harder to meet the selectivity requirement. Therefore, compared with traditional dielectric etching processes, selectively etching low-k dielectric materials requires more precise tuning of the process chemistry and process parameters.

Another problem associated with etching low-k dielectrics is the dependence of the low-k dielectric etch rate upon pattern density and topographic dimensions of etched features (e.g. vias and trenches), which is known as etch rate microloading, or microloading. The etch rate microloading is a measure of the difference in etch rate in features having different sizes, and is calculated as a percent value of the difference between etch rate in a larger feature and etch rate in a smaller feature divided by the etch rate in the larger feature. It has been noted that microloading increases as the size of an opening of the small feature decreases and as the aspect ratio of the small feature increases.

SUMMARY

The present invention provides a process for etching a low-k dielectric layer with improved selectivity to adjacent layers and reduced microloading as compared to conventional low-k dielectric etching processes. In one embodiment of the present invention, the low-k dielectric layer is formed on a substrate with an underlying barrier/liner layer and an overlying photoresist mask. The substrate is placed in a plasma etch chamber and a plasma of a gas mixture is turned on and maintained in the plasma etch chamber to etch the low-k dielectric layer. The gas mixture comprises a fluorine-rich fluorocarbon or hydrofluorocarbon gas, such as $CF_4$, $C_2F_8$, $CHF_3$, $C_2F_6$, etc., a nitrogen-containing gas, such as $N_2$, $NH_3$, $NF_3$, etc., and one or more additive gases, such as an inert gas, a hydrogen-containing gas, and/or a carbon-oxygen gas.

DRAWINGS

Additional objects and features of the invention will be more readily apparent from the following detailed description and appended claims when taken in conjunction with the drawings, in which:

DESCRIPTION

The etching process of the present invention is useful for etching a low-k dielectric layer with good etch rate and high etching selectivities with respect to an overlying mask layer and an underlying barrier/liner layer. As will be described in more detail below, the etching process is performed by exposing portions of the low-k dielectric layer not covered by the mask layer to an energized gas, such as a plasma, comprising energetic and reactive species. The plasma is usually generated in a plasma reactor, such as, for example, a magnetically enhanced reactive ion etching (MERIE)

reactor, or a dual frequency capacitive plasma source etch reactor used as a part of the CENTURA® semiconductor wafer processing system, available from Applied Materials Inc., Santa Clara, Calif.

Figure 1:
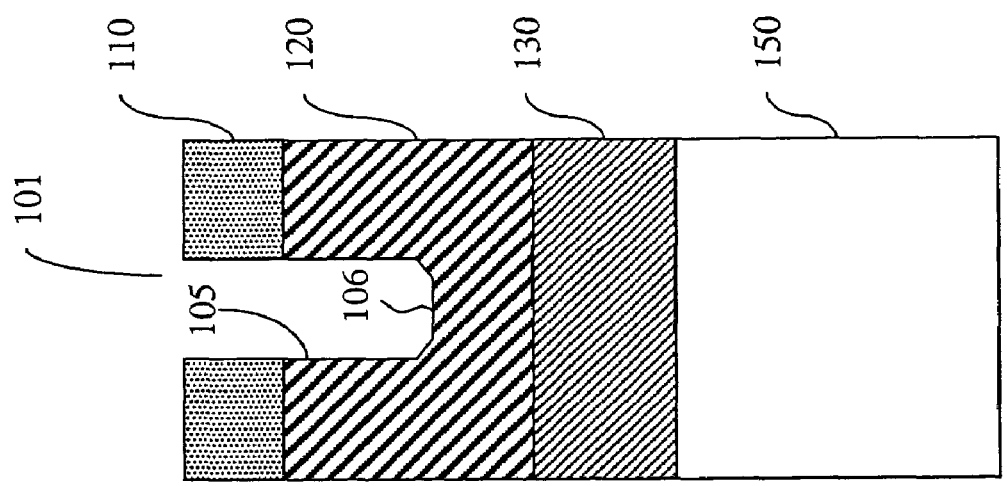
FIG. 1 is a schematic view in vertical cross-section of a trench or via in a dielectric layer in the middle of an etching process.

The low-k dielectric layer is typically formed on a substrate and patterned with a mask that defines features to be etched. FIG. 1 illustrates the cross section of a wafer 100 having a feature 101, such as a trench or via, in a low-k dielectric layer 120 on a substrate 150 in the middle of a low-k dielectric etching process, when a sidewall 105 and bottom surface 106 of the feature 101 have been exposed by the etching process, according to one embodiment of the present invention. A patterned mask layer 110 partially covers the dielectric layer 120 and defines the opening of feature 101. In some applications, the dielectric layer 120 is separated from the substrate by a barrier/liner layer 130. Metal lines (not shown) may also lie beneath the barrier/liner layer. In some applications, the barrier/liner layer 130 acts both as a diffusion barrier between the metal lines and the dielectric layer 120, and as an etch stop layer during the etching of the dielectric layer 120.

In one embodiment of the present invention, the dielectric layer 120 includes a low-k dielectric material having a dielectric constant that is less than the dielectric constant of silicon dioxide ($SiO_2$), which is about 4.0. The thickness of the low-k dielectric layer 120 is about 0.4-1.5 µm, the thickness of the mask layer 110 before etching is typically about 1930 Å, and the thickness of the barrier/liner layer 130 is usually a few hundred Angstroms. As is apparent, these layers are not drawn to scale.

Figure 2:
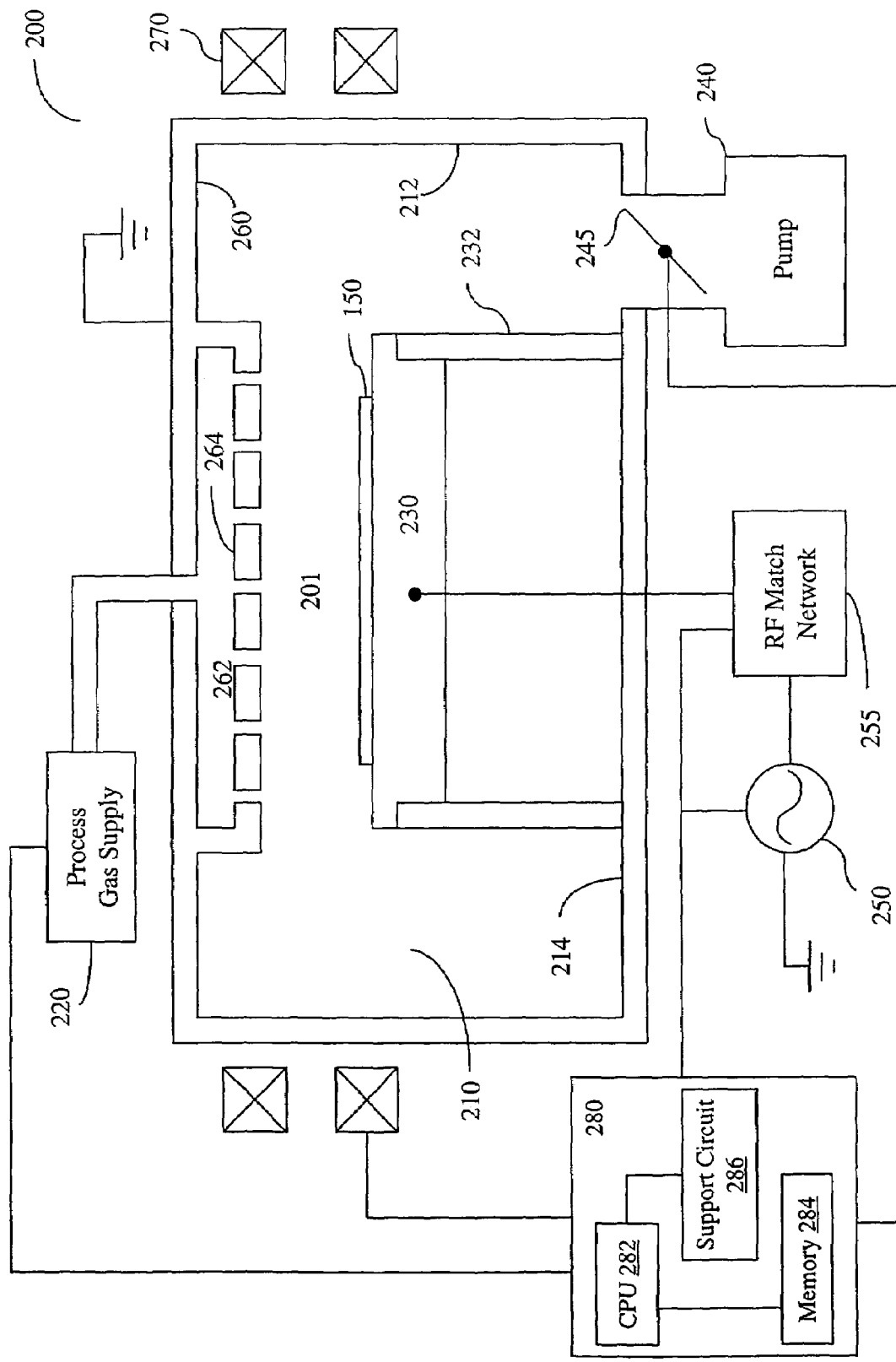
FIG. 2 is a schematic view in vertical cross-section of a plasma reactor used to practice a low-k dielectric etching process according to one embodiment of the present invention.

FIG. 2 depicts a schematic, cross-sectional diagram of the MERIE reactor 200 which is one example of a reactor that may be used to perform the processes of the present invention. The reactor 200 comprises a chamber 210 enclosed by a wall 212, a base 214, and a ceiling 260. The chamber includes a process zone 201 comprising a volume of about 5,000 to about 50,000 $cm^3$. The reactor 200 further comprises a process gas supply 220 that supplies gaseous components into the chamber 210 through a gas manifold 262 and a gas distribution plate (GDP) 264 at the ceiling 260 of the chamber 210, thereby forming the process gas. Spent process gas and volatile etch products are pumped out from the process chamber 210 by a pump 240. A throttle valve 245 controls the pressure in the chamber 210. The wall 212, the base 214, the ceiling 260, and the GDP 264 are usually made of aluminum with anodized aluminum coating on at least the surfaces facing the inside of the chamber 210. The wall 212, the base 214, the ceiling 260, and the GDP 264 are typically grounded.

The chamber 210 further includes a pedestal 230 that supports the substrate 300 in the chamber 210. The pedestal 230 is electrically isolated from the base 214 by an insulator support ring 232 and is connected to a radio frequency (RF) power source 250 through an impedance match network 255. The pedestal 230 includes an electrostatic chuck, a vacuum chuck or other wafer holding mechanisms (not shown), and may be thermally connected to a substrate temperature control system (not shown). The substrate temperature control system, such as a resistive heating coil and/or fluid passages connected to a heating or cooling fluid system, facilitates control of the temperature of the substrate 150 during plasma processing.

A controller 280 comprising a CPU 282, a memory 284, and support circuits 286 for the CPU 282 is coupled to the various components of the reactor 200 to facilitate control of the etching processes of the present invention.

The reactor configuration of FIG. 2 facilitates reactive ion etching (RIE) processes, where the plasma is generated by applying RF voltage at a power level of about 100 to about 3000 Watts to the pedestal 230 while the wall 212 and ceiling 260 are grounded. With the RF source 250 turned on, the pedestal 230 acts as a cathode electrode, while the grounded wall 212, ceiling 260 and the GDP 264 together serve as an anode electrode. The plasma is thus generated and maintained by capacitively coupled RF power between the cathode and the anode electrodes. A substantial DC bias typically exists between the plasma and the cathode electrode, resulting in energetic ion bombardment on the substrate.

FIG. 2 only shows one exemplary configuration of various types of plasma reactors that can be used to practice the present invention. For example, the reactor 200 may include other power sources in addition to or in place of the RF power source 250, and power can be coupled into the chamber 210 to strike and maintain a plasma therein through differently configured coupling hardware such as known in the art, without affecting the application of the present invention. For example, a reactor with two separate power supplies, a source power and a bias power, may be used to practice the present invention. The source power may be an RF source power applied to an inductor coil to inductively couple energy to the plasma while the bias power is another RF source power applied to a support pedestal to bias the substrate with respect to the plasma. Alternatively, the source power may be a very high frequency (VHF) (e.g., 50-250 MHz) power applied to a ceiling electrode while the bias power may be a RF power applied to a wafer support pedestal facing the ceiling electrode, or vice versa.

Figure 3:
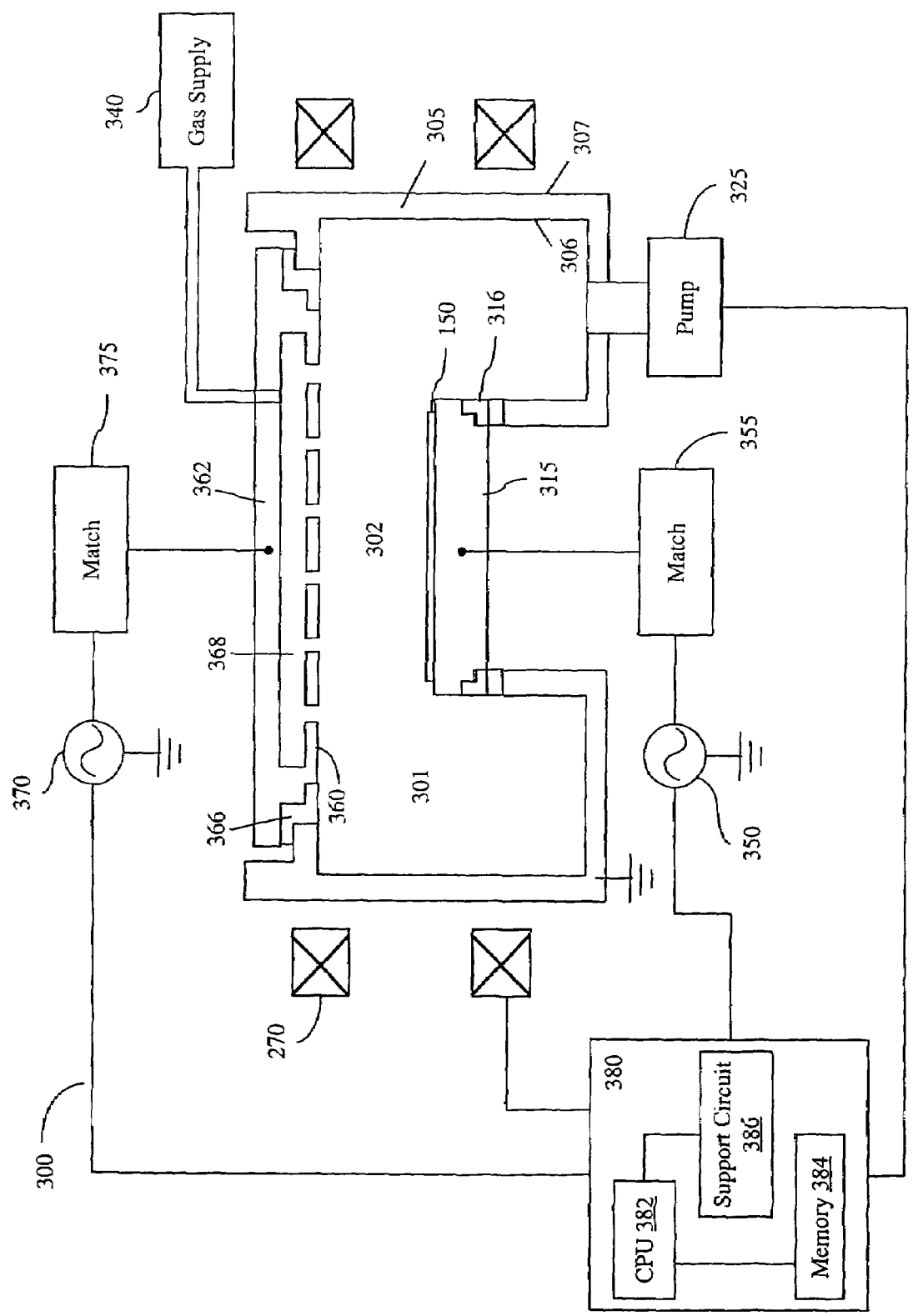
FIG. 3 is a schematic view in vertical cross-section of a plasma reactor used to practice a low-k dielectric etching process according to an alternative embodiment of the present invention.

FIG. 3 illustrates, as another example, a reactor 300 employing two separate power supplies, a RF bias power supply 350 and a VHF source power supply 370, according to an alternative embodiment of the present invention. The reactor 300 includes a vacuum chamber 301 enclosed by a cylindrical wall 305 and a conductive ceiling 362. In one embodiment of the present invention, the wall 305 of the vacuum chamber 301 is made of aluminum and is grounded. An inner surface 306 and outer surface 307 of the wall 305 are anodized to prevent corrosion. A wafer support pedestal or bottom electrode 315 lies at the bottom of the vacuum chamber 301 and supports the substrate 150. The wafer support pedestal 315 is insulated from the chamber wall 305 by an insulator ring 316 and includes mechanisms for holding the substrate 150 and for controlling the substrate temperature. A vacuum pump 325 maintains a vacuum within the vacuum chamber 301.

The RF bias power supply 350 and the VHF source power supply 370 are each connected to a respective one of two electrodes, a bottom electrode 315 which is also the wafer support pedestal and a top electrode 360. The bottom electrode is electrically connected to the RF bias power supply 350 through a bottom impedance match network 355. The top electrode 360 is in contact with the conductive ceiling 362, which in turn is connected to the source power supply 370 through a top impedance match network 375. In one embodiment of the present invention, the top electrode is also a gas distribution plate (GDP) and has gaps or holes allowing the process gas to flow into the chamber 301. For that purpose, a space 368 is provided between the conductive plate 362 and the top electrode 360 to act as a gas distribution manifold coupled to a gas supply 340. A support ring 366 supports the top electrode 360 and provides insulation between the top electrode 360 and the vacuum chamber wall 305.

In one embodiment of the present invention, the frequencies of the bias and source power supplies 350 and 370 are 13.5 MHz and 60 MHz, respectively. Filtering is employed to minimize the interaction between the two RF power supplies. In one embodiment of the present invention, such filtering is accomplished by using an inductor in the match network 375 that grounds the top electrode 360 at 13.6 MHz while appearing to be a high impedance for a 60 MHz signal. Similarly, a capacitor can be used in the match network 355 to ground the lower electrode 315 at 60 MHz while appearing to be a high impedance for a 13.6 MHz signal. Therefore, the two RF power sources 350 and 370 are independently controllable so that the relative amount of power coupled into the vacuum chamber 301 from the source power 370 and from the bias power source 350 can be apportioned as desired. To a fair approximation, the VHF source power 370 controls the plasma density, due to the more efficient displacement current and sheath heating mechanisms associated with higher RF frequencies. The lower frequency excitation from the bias RF power source 350 controls the substrate bias or the energy of the ions bombarding the wafer 150. Thus, reactor 300 allows separate control of the plasma density and the substrate bias.

In one embodiment of the present invention, the operation of the reactor 300 is controlled by a controller 380 comprising a CPU 382, a memory 384, and support circuits 386 for the CPU 382, according to program instructions stored in memory 384. The controller 380 is coupled to the various components of the reactor 300 to facilitate control of the etching processes of the present invention.

To perform the etching processes of the present invention using either reactor 200 or reactor 300, chamber 210 or 301 is evacuated by pump 240 or 325 to a pressure of less than about 1 mTorr. The substrate 150 is transferred into the chamber 210 or 301 from a load lock transfer chamber (not shown) maintained at near vacuum, and is placed on the pedestal 230 or 315. Gaseous components are then introduced into the chamber 210 or 301 at various volumetric flow rates to form the process gas. Once the pressure in the chamber 210 is stabilized at a desired level, the power source 250 or 370 is turned on to strike a plasma of the process gas in the process zone 201 or 302. When reactor 300 is used, the bias power 350 may also be turned on and adjusted to a proper level to obtain the desired bias between the pedestal 315 and the plasma. The plasma density, defined as the number of ions per unit volume, may be enhanced by placing magnets 270 around the chamber wall 212 or 305 to provide a slowly rotating magnetic field in the chamber 210 or 301. The magnets may be electromagnets driven with respective phases of a low frequency (e.g., 0.1-0.5 Hertz) AC current source (not shown). Alternatively, the magnets may be permanent magnets mounted on a slowly rotating support structure (not shown) rotating at, for example, 0.1-0.5 revolutions per second.

Plasma containing fluorocarbon or hydrofluorocarbon gas has been used to etch silicon oxides. The fluorocarbon or hydrofluorocarbon gas contributes fluorine and $CF_x$ species in the plasma that breaks the Si—O bond in the dielectric layer 120. The etching reaction may include,

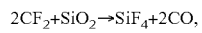

where the etch products $SiF_4$ and CO are both volatile and can be pumped out of the chamber 210. At the same time, some $CF_x$ species (x=1, 2, 3) may form polymeric passivating deposits on the feature surfaces by recombining with each other or with other species before reacting with the dielectric layer. Because the feature sidewalls 105 are subject to less ion bombardment from the plasma than the feature bottom surface 106, these passivating deposits accumulate more on the feature sidewalls 105, resulting in enhanced anisotropic etching. In fact, during the etching of conventional dielectrics such as silicon dioxide films, the $CF_x$ species are considered crucial in achieving anisotropic etching profile. Thus, many etching chemistries for etching silicon dioxide films use fluorocarbon gases with relatively high carbon to fluorine ratios, such as $C_2F_6$, $C_4F_6$, etc., in order to provide enough passivating deposits for sidewall protection.

The use of a fluorocarbon gas with a relatively high carbon to fluorine ratio, however, often results in slower etch rate and larger microloading. The inventors of the present invention have found that, when etching carbon-doped low-k dielectrics, the presence of carbon in the low-k dielectrics allows the use of fluorine-rich fluorocarbon or hydrofluorocarbon gases, i.e., fluorocarbon or hydrofluorocarbon gases with relatively low carbon to fluorine ratios. Examples of the fluorine-rich fluorocarbon or hydrofluorocarbon gases include $CF_4$, $C_2F_8$, $CHF_3$, etc., of which $CF_4$ is more often preferred. Because of the release of carbon during the etching processes from the low-k dielectrics, especially low-k dielectrics with relatively high amount of carbon content (e.g. more than 8% carbon), enough sidewall protection can be achieved with the use of the fluorine-rich fluorocarbon or hydro-fluorocarbon gases. As a result, the use of a fluorine-rich fluorocarbon or hydrofluorocarbon gas in a low-k dielectric etching process often results in a higher low-k dielectric etch rate, better selectivity to photoresist mask, and a smaller amount of microloading.

Figure 4A:
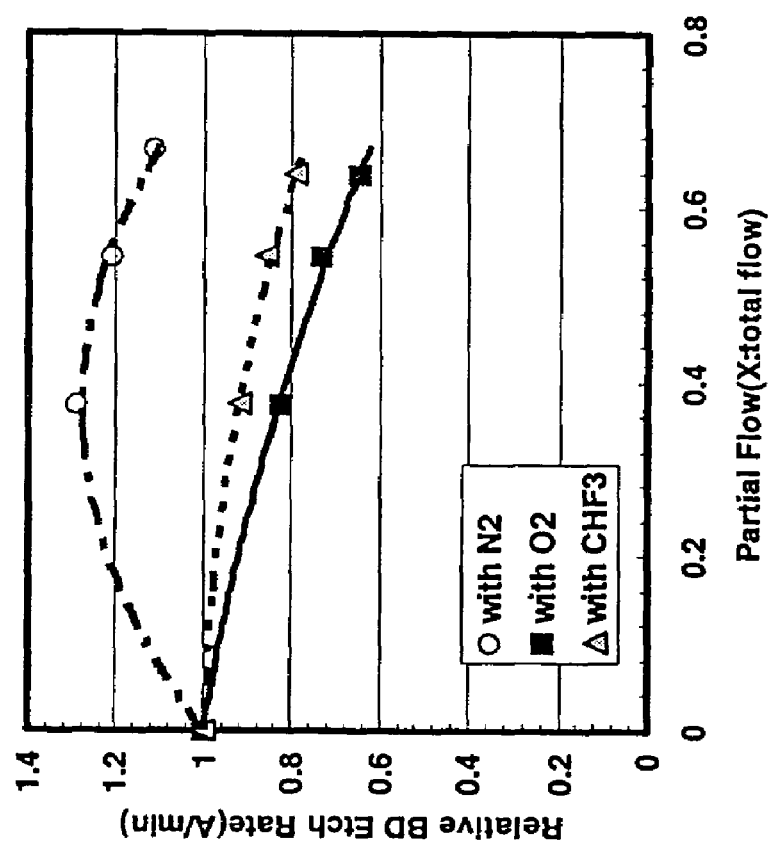
FIG. 4A is a chart showing changes in low-k dielectric etch rate in response to different additives to a fluorocarbon based plasma.
Figure 4B:
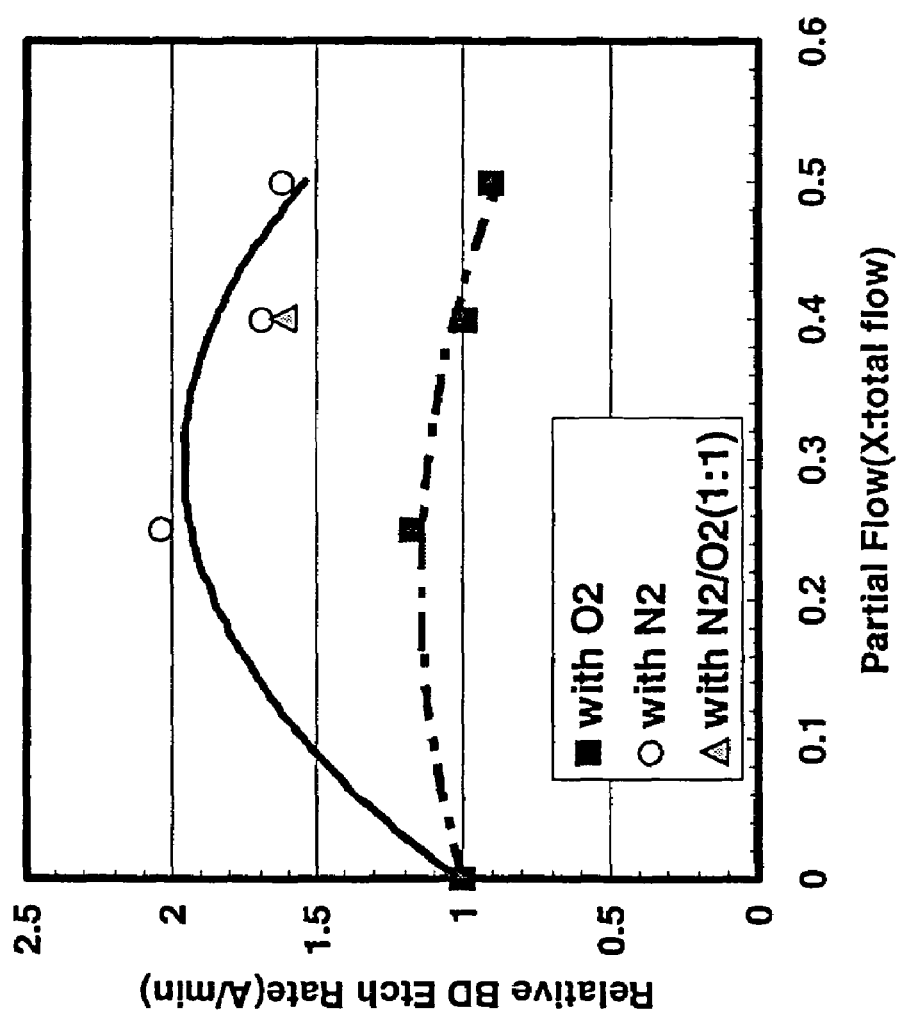
FIG. 4B is a chart showing changes in low-k dielectric etch rate in response to different additives to a fluorocarbon/hydrofluorocarbon mixture based plasma.

The more complicated chemical compositions in the low-k dielectric layer 320 often require more complicated chemistry in the process gas. For low-k dielectrics such as carbon-doped silicon dioxide films containing alkyl groups such as $CH_3$, a nitrogen-containing gas in the process gas has been found to help in breaking the Si—$CH_3$ bond without adversely impacting the etching selectivity to photoresist. As shown in FIGS. 4A and 4B, adding a certain amount of $N_2$ to a $CF_4$ based process gas or a $CF_4$/$CHF_3$ mixture based process gas results in significant increase in the low-k dielectric etch rate. Thus the process gas in one embodiment of the present invention often includes a nitrogen containing gas. Suitable nitrogen containing gases include $N_2$, $NH_3$, $NF_3$, of which $N_2$ is more often used. FIGS. 4A and 4B also show that the low-k dielectric etch rate starts to drop when the volumetric flow rate ratio (or flow ratio) of $N_2$:$CF_4$ or $N_2$:$CF_4$/$CHF_3$ increases beyond 0.4 or 0.3, respectively, therefore there may exist an optimum range of the $N_2$:$CF_4$ or $N_2$:$CF_4$/$CHF_3$ flow ratio depending on specific application.

Besides the fluorine-rich fluorocarbon or hydrofluorocarbon gas and the nitrogen-containing gas, the process gas often includes one or more additive gases, such as a hydrogen-containing gas, an inert gas, and/or a carbon-oxygen gas. The hydrogen-containing gas can be added to provide hydrogen or hydrogen-containing radicals in the etching plasma that, when combined with nitrogen or nitrogen-containing radicals, break the Si—$CH_3$ bond faster, resulting in faster etch rate and higher etching selectivity to photoresist. Suitable hydrogen-containing gases include hydrogen-rich hydrofluorocarbon gases such as $CH_2F_2$, $CH_3F$, etc. With the nitrogen-containing gas and the hydrogen-containing gas in the process gas, the etching reaction may include

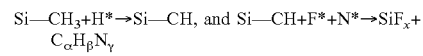

where α, β, and γ are integers, and the etch products $C_\alpha H_\beta N_\gamma$ are typically volatile. Other possible by-products resulting from the interactions between the plasma and the low-k dielectric layer may include CO, CN, $NH_x$, $NF_x$, HF, $C_3H_2$, etc.

Figure 5A:
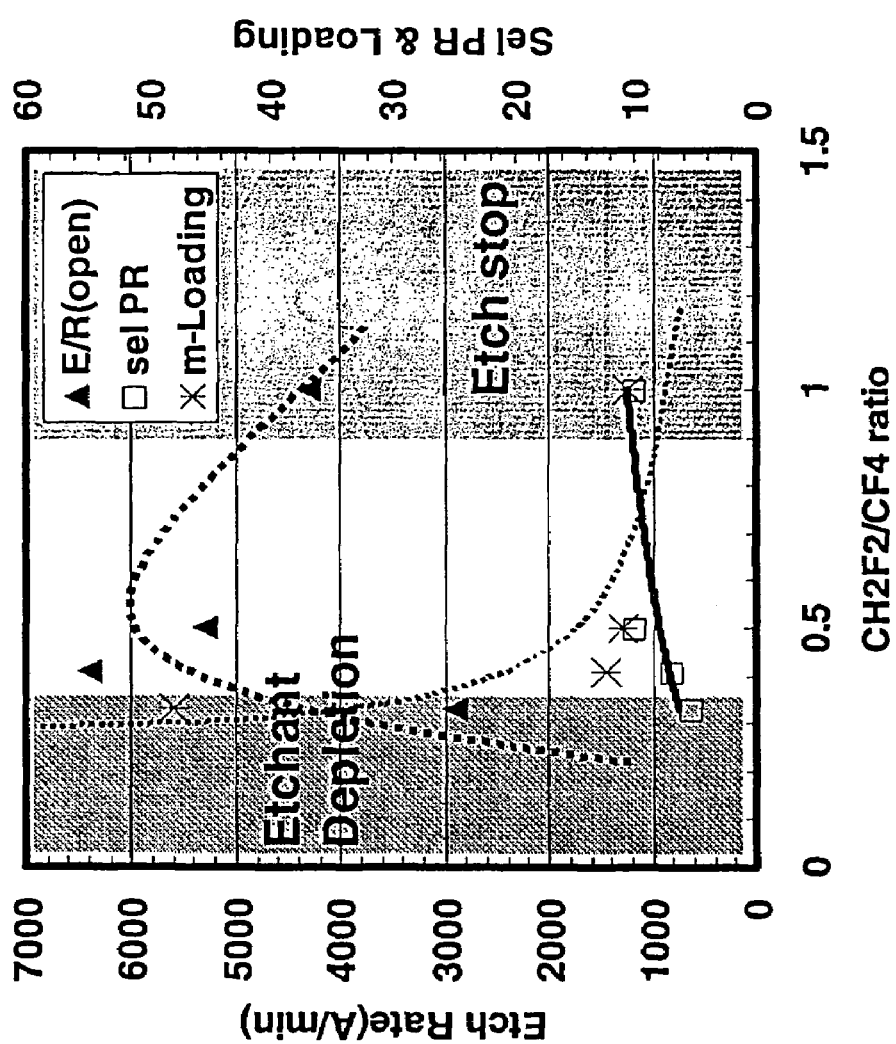
FIG. 5A is a chart showing the trend of change in low-k dielectric etch rate, etching selectivity to photoresist, and microloading in response to change in $CH_2F_2/CF_4$ flow ratio according to one embodiment of the present invention.
Figure 5B:
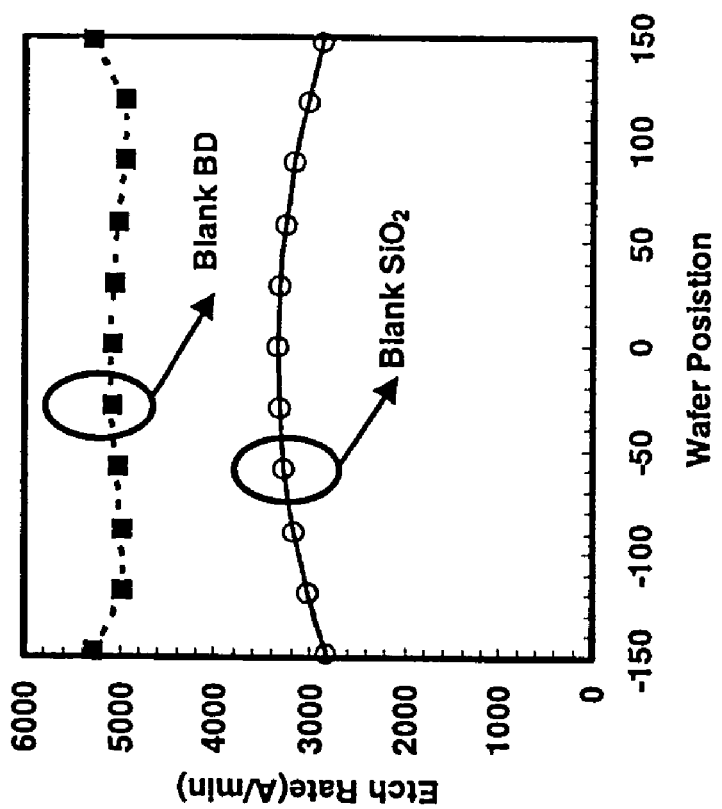
FIG. 5B is a chart showing the low-k dielectric etch rate uniformity across a 300 mm substrate, according to one embodiment of the present invention.

The addition of a hydrogen-rich fluorocarbon gas as the hydrogen-containing gas has also been found to help widening the process window and therefore improving etch rate microloading and etch rate uniformity across the substrate. As shown in FIG. 5A, when a $CH_2F_2$ gas is added to a $CF_4$-based plasma, etch rate microloading rapidly drops, indicating a much wider process window. The improved process window is also manifested by the good etch uniformity resulting from the addition of the hydrogen-rich fluorocarbon gas, as shown in FIG. 5B, which illustrates the etch rate uniformity of a blanket low-k dielectric layer across a 300 mm substrate when a $CF_4/N_2/CH_2F_2$ process gas is used. Also, as shown in FIG. 5A, with the addition of the $CH_2F_2$ gas, the etch rate increases sharply and there is significant improvement in the etching selectivity with respect to a photoresist mask. The etch rate starts to drop when the $CH_2F_2:CF_4$ flow rate ratio further increases beyond 0.5. Therefore, there may exist an optimum range for the $CH_2F_2:CF_4$ flow rate ratio depending on specific application.

The addition of an inert gas in the process gas has been found to help controlling the etched feature profile. This is possibly due to the inert ions in the etching plasma that impinge mostly on the bottom surface 106 of the etched feature 101, activating chemical reactions thereon while leaving the sidewalls 105 of the feature less affected. The inert ions also help to reduce etch product deposits by sputtering them off the feature surfaces. Suitable inert gases include argon, helium, neon, xenon, and krypton, of which argon is more often preferred.

The addition of a carbon-oxygen gas has been found to improve the etching selectivity to the barrier/liner layer, which often includes a silicon carbide material. A suitable carbon-oxygen gas is CO.

The volumetric flow rate of each gas in the process gas depends on many factors, including the configuration of the reactor used to carry out the etching process, the size of the substrate, and the specific gases used in the process gas. The volumetric flow ratios of the different gases in the process gas can also be tailored for different combinations of materials and to achieve specific etching selectivities, etch rates, or feature geometry without deviating from the scope of the present invention. In one embodiment of the present invention, when the process gas includes $CF_4$ as the fluorocarbon gas, $N_2$ as the nitrogen-containing gas, and $CH_2F_2$ as the hydrogen-rich hydrofluorocarbon gas, the flow ratio of $N_2:CF_4$ is about 1:4 to 2:1, and the flow ratio of $CH_2F_2:CF_4$ is about 1:3 to 1:1, and more often about 1:3 to 1:2. Relatively high volumetric flow of the inert gas has been found to achieve optimum profile. In one embodiment of the present invention, when the process gas includes argon as the inert gas, the flow ratio of argon to the fluorocarbon gas is from about 20:1 to 50:1.

EXAMPLES

The following examples illustrate use of the present invention for etching the low-k dielectric layer 120 on substrate 150. An example of substrate 150 is a silicon wafer of 200 mm (8 inch) or 100 mm (12 inch) diameter. As shown in FIG. 1, the wafer 150 is coated successively with the barrier/liner layer 130 having a thickness of a few hundred angstroms, the low-k dielectric layer 120 having a thickness of about 0.4-1.5 micron, and a mask layer 110 of about 1930 Å that is patterned to define features such as feature 101 to be etched.

In the following examples, the mask layer is photoresist, such as "RISTON," manufactured by duPont de Nemours Chemical Company. The low-k dielectric layer comprises carbon-doped dielectrics such as $CH_3$ doped organo-silicate glass (OSG), organic polymers (e.g. benzocyclobutene, parylene, polytetrafluoroethylene, polyether, polyimide) or the like that are doped with a carbon-based dopant (e.g. $CH_3$). The OSG is sometimes referred to as doped silicon dioxide, examples of which are Black Diamond™ I and Black Diamond™ II, which is an improved version of the Black Diamond™ I with higher carbon content than Black Diamond™ I. Both Black Diamond™ I and Black Diamond™ II are available from Applied Materials of Santa Clara, Calif. Other examples of the OSG are Coral™ from Novellus of San Jose, Calif., and Sumika Film™ from Sumitomo Chemical America, Inc., Santa Clara, Calif. In the case of Black Diamond™ I, the OSG layer is grown using chemical vapor deposition by oxidizing methyl silane, as disclosed by Yau et al. in U.S. Pat. Nos. 6,054,379 and 6,072,227. The number of methyl radicals in this and related materials may vary from one to four for a monosilane.

The barrier/liner layer is a BLOk™ (barrier low-k) film, which is a silicon carbide film formed using the chemical vapor deposition (CVD) or plasma enhanced CVD process described in commonly owned U.S. Pat. No. 6,287,990 B1, issued Sep. 11, 2001, and U.S. Pat. No. 6,303,523 B2, issued Oct. 16, 2001, which are incorporated herein by reference. The BLOk™ films include BLOk™ I and BLOk™ II, which is an improved version of BLOk™ I, both of which are available from Applied Materials of Santa Clara, Calif. Various layers of other materials may lie under the barrier/liner layer, which should not affect the practice of the present invention.

A thin (600 Å) antireflective coating (ARC) or bottom antireflective coating (BARC) layer (not shown) and a hard mask layer may lie between the mask layer 310 and the OSG layer 320. The ARC (or BARC layer) is typically used for line/width control during photolithography when the minimum feature sizes reach below quarter micron. A conventional ARC (or BARC) open process can be performed to clear away the ARC (or BARC layer) at the feature openings before etching the low-k dielectric layer. The hard mask layer is typically made of a conventional dielectric material such as silicon dioxide and is used as a stop layer during a subsequent CMP process for creating damascene of dual-damascene structures. A conventional hard mask etching process can be used to clear away portions of the hard mask layer at the feature openings before etching the low-k dielectric layer.

Figure 6:
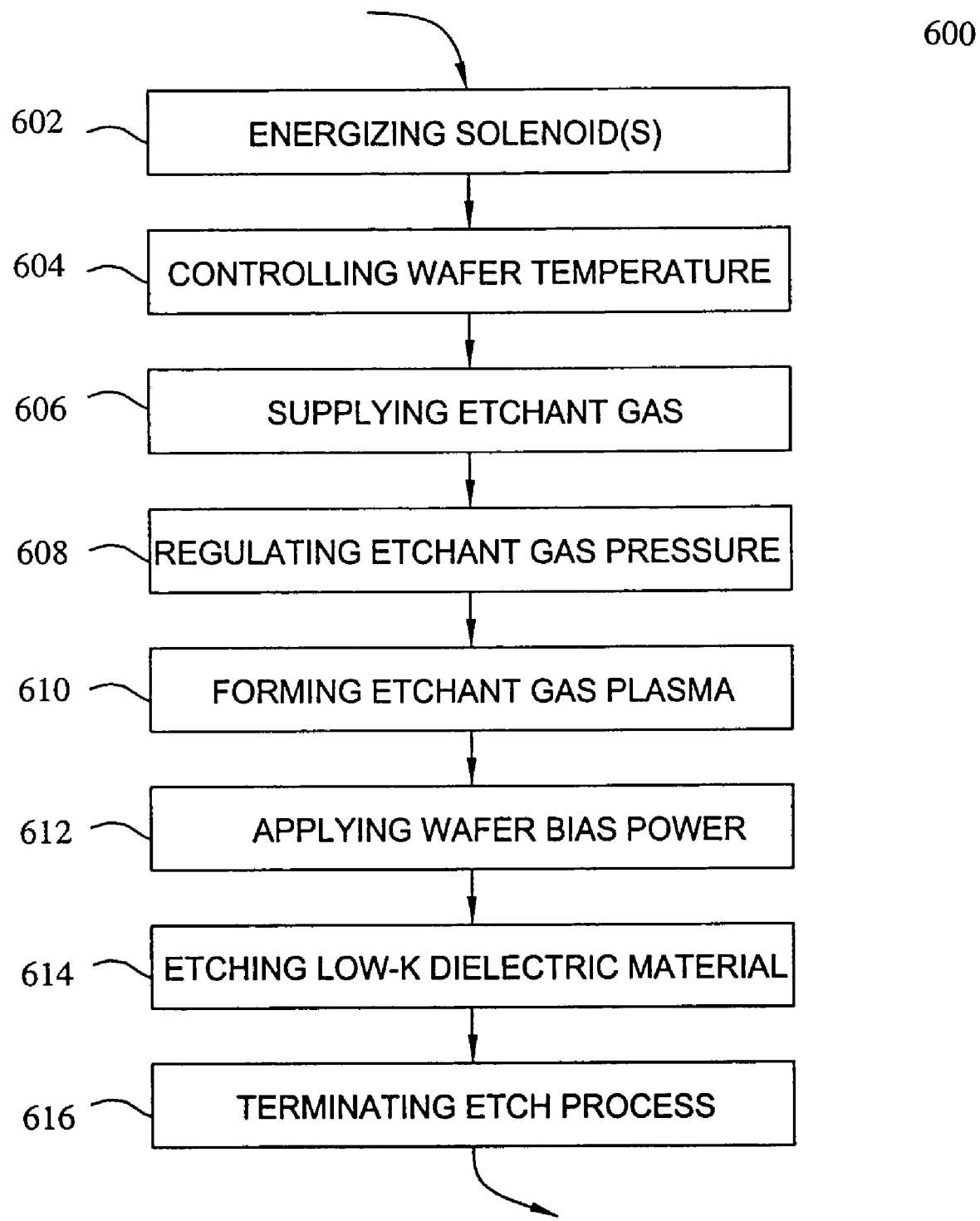
FIG. 6 is a flow chart illustrating a process sequence for etching a low-k dielectric material according to one embodiment of the present invention.

FIG. 6 is a flow chart illustrating a process sequence 600 for etching the dielectric layer 120 in the reactor 200 shown in FIG. 2 or in the reactor 300 shown in FIG. 3, according to two exemplary embodiments of the present invention. The sequence 600 includes an optional step 602, in which the magnets 270 are turned on to create a magnetic field in the process chamber 210 or 301 above the wafer substrate 150. The sequence 600 further includes step 604, in which wafer temperature (or cathode temperature) is set and further maintained at a predetermined value by controlling, e.g., a flow of the backside gas such as He.

The wafer temperature is maintained sufficiently high to volatilize most of the etch products, and sufficiently low so that a layer of passivating deposits and etch product deposits is retained on the sidewalls 105 of freshly etched feature 101. The chamber wall 212 or 305 is also kept at a controlled temperature level, such as about 15° C., using a conventional cooling or heating mechanism as necessary for maintaining the chamber wall temperature.

The sequence 600 further includes step 606, in which the process gas is supplied to the process chamber 210 or 301 through the gas distribution plate 264 or 360. The sequence 600 further includes step 608, in which the pressure of the process gas in the process chamber 210 or 301 is adjusted by regulating at least one process parameter such as the flow rate of one or more gaseous components, or a position of the throttle valve 225 or 325, respectively.

When reactor 300 is used, the sequence 600 further includes step 610, in which the VHF source power 370 ignites the process gas in processing chamber 301 to form the plasma by applying power from the VHF source 370 to the top electrode 360. Thereafter or about simultaneously with igniting the plasma, at step 612 in the process sequence 600, the RF bias power 350 is turned on to electrically bias the wafer support pedestal. When reactor 200 is used, step 610 and step 612 are both accomplished by turning on the RF power 250, which ignites the process gas in processing chamber 210 as well as biases the wafer support pedestal.

The process sequence 600 further includes step 614, in which the dielectric layer 120 is etched using plasma 152 to form a plurality of features including feature 101 in the dielectric layer 120. In one embodiment of the present invention, step 614 etches Black Diamond™ with a selectivity to BLok™ layer of about 10:1 or greater and a selectivity to a photoresist mask of about 5:1 or greater. Step 614 continues for a predetermined time period or is terminated using a conventional optical endpoint measurement technique that determines, by monitoring emissions from the plasma, whether the bottom surfaces (such as surface 106 in feature 101) in the plurality of features has reached the top of the etch stop layer 130. Thereafter, at step 616 in the process sequence 600, the plasma is turned off by turning off the VHF source power 370 and/or the bias source 250 or 350. The magnets 270 may be turned off also and the process gas supply is stopped. Then the wafer is dechucked and removed from the processing chamber 210 or 301.

The foregoing steps of the sequence 600 need not be performed sequentially, e.g., some or all of the steps may be performed simultaneously or in different order. In one embodiment of the present invention, sequence 600 is performed by the controller 280 shown in FIG. 2 or the controller 380 shown in FIG. 3, according to program instructions stored in memory 284 or 384, respectively. Alternatively, some or all of the steps in the sequence 600 may be performed in hardware such as an application-specific integrated circuit (ASIC) or other type of hardware implementation, or a combination of software or hardware.

Table I and II summarizes the ranges, i.e., minimum and maximum values, and exemplary values of several process parameters used to etch the low-k dielectric layer 320 on a 300 mm wafer using the etch reactor 300 shown in FIG. 3.

TABLE I

| Process Parameters | | Minimum | Maximum | Example |
|---|---|---|---|---|
| Process Gas | $CF_4$ | 2 | 200 | 20 |
| Flow Rate (sccm) | $N_2$ | 4 | 400 | 40 |
| | $CH_2F_2$ | 4 | 400 | 40 |
| | Ar | 500 | — | 2000 |
| Source Power (W) | | 100 | 300 | 200 |
| Bias Power (W) | | 1500 | 2500 | 2000 |

TABLE I-continued

| Process Parameters | Minimum | Maximum | Example |
|---|---|---|---|
| Chamber Pressure (mTorr) | 60 | 150 | 100 |
| Wafer Pedestal Temperature (° C.) | 0 | 30 | 20 |

TABLE II

| Process Parameters | | Minimum | Maximum | Example |
|---|---|---|---|---|
| Process Gas | $CF_4$ | 50 | 80 | 65 |
| Flow Rate (sccm) | $N_2$ | 50 | 200 | 170 |
| | Ar | 100 | 1500 | 500 |
| | CO | 0 | 300 | 2000 |
| Source Power (W) | | 0 | 1000 | 300 |
| Bias Power (W) | | 1000 | 3000 | 2800 |
| Chamber Pressure (mTorr) | | 10 | 150 | 30 |
| Cathode Temperature (° C.) | | −20 | 40 | −10 |

Table III and IV list some of the process parameters such as RF power, pressure, process gas composition and flow rates, etc. used in several exemplary processes for etching the dielectric layer 320 on a 300 mm wafer in reactor 200.

TABLE III

| | Process Gas flow rate (sccm) | | | | Pressure | RF | Cathode |
|---|---|---|---|---|---|---|---|
| | $CF_4$ | $N_2$ | Ar | $CH_2F_2$ | (mT) | (W) | Temperature |
| Example 1 | 40 | 20 | 2000 | 20 | 100 | 2000 | 15° C. |
| Example 2 | 60 | 60 | 2000 | 30 | 100 | 2000 | 15° C. |
| Example 3 | 60 | 60 | 2000 | 30 | 100 | 2000 | 30° C. |

TABLE IV

| | Process Gas flow rate (sccm) | | | | Pressure | RF | Substrate |
|---|---|---|---|---|---|---|---|
| | $CF_4$ | $N_2$ | Ar | $CH_3F$ | (mT) | (W) | Temperature |
| Example 4 | 40 | 40 | 2000 | 15 | 100 | 2000 | 15° C. |

Scanning electron micrograph (SEM) photos of etched test wafers were used to measure the etch rate, etching selectivity with respect to photoresist, and etch rate microloading. Table V lists some of the results of measurement corresponding to exemplary process parameters listed in Table III and IV. As shown in the table, these exemplary embodiments of the present invention provide a low-k dielectric etch rate greater than about 4000 Å/min and an etching selectivity to photoresist higher than about 6:1.

TABLE V

| | Etch Rate (Å/min) | | PR | Microloading |
|---|---|---|---|---|
| | In small features | In open spaces | Selectivity | (%) |
| Example 1 | 3900 | 4300 | >6:1 | 9.3 |
| Example 2 | 4800 | 5300 | >7:1 | 11 |
| Example 3 | 5500 | 6100 | 7:1 | 10 |
| Example 4 | Not measured | Not measured | >8:1 | Not measured |

Because the actual process parameters, such as the RF power, pressure, gas flow rates, etc., are dependent upon the size of the wafer, the volume of the chamber, and on other hardware configurations of the reactor used to practice the present invention, the invention is not limited to process parameters or the ranges recited herein.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A plasma etch process for selectively etching a layer of low-k dielectric material having a dielectric constant less than 4, comprising:

introducing into a plasma etch chamber, in which the layer of low-k dielectric material is situated, an etching gas mixture comprising a fluorine-rich fluorocarbon or hydrofluorocarbon gas, a nitrogen-containing gas, and a hydrogen-rich hydrofluorocarbon gas; and maintaining a plasma of the etching gas mixture in the plasma etch chamber to etch the layer of low-k dielectric material, wherein the plasma of the etching gas mixture etches the low-k dielectric layer with an etch rate higher than about 4000 Å/min.

2. The process of claim 1 wherein the fluorine-rich fluorocarbon gas is $CF_4$, the nitrogen-containing gas is $N_2$, and the hydrogen-rich hydrofluorocarbon gas is selected from the group consisting of $CH_2F_2$, $CH_3F$, and mixtures thereof.

3. The process of claim 1 wherein the fluorine-rich fluorocarbon or hydrofluorocarbon gas is selected from the group consisting of $CF_4$, $C_2F_8$, $CHF_3$, and mixtures thereof.

4. The process of claim 1 wherein the nitrogen-containing gas is selected from the group consisting of $N_2$, $NH_3$, $NF_3$, and mixtures thereof.

5. The process of claim 1 wherein the hydrogen-rich hydrofluorocarbon gas is selected from the group consisting of $CH_2F_2$, $CH_3F$, and mixtures thereof.

6. The process of claim 1 wherein the etching gas mixture is introduced into the plasma etch chamber by introducing the fluorine-rich fluorocarbon or hydrofluorocarbon gas at a first volumetric flow rate, the nitrogen-containing gas at a second volumetric flow rate, and a hydrogen-rich hydrofluorocarbon gas at a third volumetric flow rate, and wherein the ratio of the second volumetric flow rate to the first volumetric flow rate is about 1:4 to 2:1.

7. The process of claim 1 wherein the etching gas mixture is introduced into the plasma etch chamber by introducing the fluorine-rich fluorocarbon or hydrofluorocarbon gas at a first volumetric flow rate, the nitrogen-containing gas at a second volumetric flow rate, and a hydrogen-rich hydrofluorocarbon gas at a third volumetric flow rate, and wherein the ratio of the third volumetric flow rate to the first volumetric flow rate is about 1:3 to 1:1.

8. The process of claim 1 wherein the layer of low-k dielectric material is over a substrate placed on a pedestal in the plasma etch chamber, and maintaining a plasma of the etching gas mixture comprises capacitively coupling RF power into the plasma etch chamber such that a substantial DC bias exists between the pedestal and the plasma.

9. The process of claim 1 wherein the layer of low-k dielectric material is over a substrate placed on a pedestal in the plasma etch chamber, and maintaining a plasma of the etching gas mixture comprises:

applying a bias power to the pedestal; and applying a source power to a top electrode facing the pedestal, wherein the source power has a frequency higher than a frequency of the bias power.

10. The process of claim 1 wherein maintaining a plasma of the etching gas mixture further comprises applying a slowly rotating magnetic field in the chamber.

11. The process of claim 1 wherein the etching gas mixture further comprises an inert gas selected from the group consisting of argon, helium, neon, xenon, and krypton.

12. The process of claim 11 wherein the etching gas mixture is introduced into the plasma etch chamber by introducing the fluorine-rich fluorocarbon or hydrofluorocarbon gas at a first volumetric flow rate, and the inert gas at a second volumetric flow rate, and wherein the ratio of the second volumetric flow rate to the first volumetric flow rate is about 20:1 to 50:1.

13. A plasma etch process for selectively etching a layer of low-k dielectric material having a dielectric constant less than 4, comprising:

introducing into a plasma etch chamber, in which the layer of low-k dielectric material is situated, an etching gas mixture comprising a fluorine-rich fluorocarbon or hydrofluorocarbon gas, a nitrogen-containing gas, and a hydrogen-rich hydrofluorocarbon gas; and maintaining a plasma of the etching gas mixture in the plasma etch chamber to etch the layer of low-k dielectric material, wherein the etching gas mixture is introduced into the plasma etch chamber by introducing the fluorine-rich fluorocarbon or hydrofluorocarbon gas at a first volumetric flow rate, the nitrogen-containing gas at a second volumetric flow rate, and a hydrogen-rich hydrofluorocarbon gas at a third volumetric flow rate, and wherein the ratio of the second volumetric flow rate to the first volumetric flow rate is about 1:4 to 2:1.

14. The process of claim 13 wherein the fluorine-rich fluorocarbon or hydrofluorocarbon gas is selected from the group consisting of $CF_4$, $C_2F_8$, $CHF_3$, and mixtures thereof.

15. The process of claim 13 wherein the hydrogen-rich hydrofluorocarbon gas is selected from the group consisting of $CH_2F_2$, $CH_3F$, and mixtures thereof.

16. A plasma etch process for selectively etching a layer of low-k dielectric material having a dielectric constant less than 4, comprising:

introducing into a plasma etch chamber, in which the layer of low-k dielectric material is situated, an etching gas mixture comprising a fluorine-rich fluorocarbon or hydrofluorocarbon gas, a nitrogen-containing gas, and a hydrogen-rich hydrofluorocarbon gas; and maintaining a plasma of the etching gas mixture in the plasma etch chamber to etch the layer of low-k dielectric material, wherein the etching gas mixture is introduced into the plasma etch chamber by introducing the fluorine-rich fluorocarbon or hydrofluorocarbon gas at a first volumetric flow rate, the nitrogen-containing gas at a second volumetric flow rate, and a hydrogen-rich hydrofluorocarbon gas at a third volumetric flow rate, and wherein the ratio of the third volumetric flow rate to the first volumetric flow rate is about 1:3 to 1:1.

17. The process of claim 16 wherein the fluorine-rich fluorocarbon or hydrofluorocarbon gas is selected from the group consisting of $CF_4$, $C_2F_8$, $CHF_3$, and mixtures thereof.

18. The process of claim 16 wherein the hydrogen-rich hydrofluorocarbon gas is selected from the group consisting of $CH_2F_2$, $CH_3F$, and mixtures thereof.

* * * * *